(12) United States Patent
Haimi-Cohen et al.

(10) Patent No.: US 9,600,899 B2
(45) Date of Patent: *Mar. 21, 2017

(54) METHODS AND APPARATUSES FOR DETECTING ANOMALIES IN THE COMPRESSED SENSING DOMAIN

(71) Applicant: Alcatel-Lucent USA Inc., Murray Hill, NJ (US)

(72) Inventors: Raziel Haimi-Cohen, Springfield, NJ (US); Hong Jiang, Warren, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 542 days.

This patent is subject to a terminal disclaimer.

(21) Appl. No.: 14/136,335

(22) Filed: Dec. 20, 2013

(65) Prior Publication Data

US 2015/0178944 A1     Jun. 25, 2015

(51) Int. Cl.
*G06K 9/00* (2006.01)
*G06T 7/20* (2006.01)
(Continued)

(52) U.S. Cl.
CPC ........ *G06T 7/2033* (2013.01); *G06K 9/00744* (2013.01); *G06K 9/00771* (2013.01);
(Continued)

(58) Field of Classification Search
CPC ..... G06T 7/2033; G06T 7/0085; G06T 7/204; G06T 7/206; G06T 2207/10016; G06T 2207/30232; G06T 2207/30241; G06T 9/00744; G06T 9/00771; G06T 9/4604; G06T 9/4642; G06T 9/6232; H03M 7/3062

See application file for complete search history.

(56) References Cited

U.S. PATENT DOCUMENTS 3,775,602 A   11/1973   Alexandridis et al.
5,070,403 A   12/1991   Wilkinson
(Continued)

FOREIGN PATENT DOCUMENTS

CN   101309404   11/2008
CN   101964910   2/2011
(Continued)

OTHER PUBLICATIONS

Budhaditya et al., "Effective anomaly detection in sensor networks data streams", Dec. 9, 2009, IEEE, 9th IEEE Int. Conf. on Data Mining 2009, p. 722-727.*

(Continued)

*Primary Examiner* — Chan Park
*Assistant Examiner* — Timothy Choi
(74) *Attorney, Agent, or Firm* — Harness, Dickey & Pierce, P.L.C.

(57) ABSTRACT

A measurement vector of compressive measurements is received. The measurement vector may be derived by applying a sensing matrix to a source signal. At least one first feature vector is generated from the measurement vector. The first feature vector is an estimate of a second feature vector. The second feature vector is a feature vector that corresponds to a translation of the source signal. An anomaly is detected to in the source signal based on the first feature vector.

19 Claims, 5 Drawing Sheets

(51) Int. Cl.
*G06T 7/00* (2006.01)
*H03M 7/30* (2006.01)
*G06K 9/46* (2006.01)
*G06K 9/62* (2006.01)

(52) U.S. Cl.
CPC ......... *G06K 9/4604* (2013.01); *G06K 9/4642* (2013.01); *G06K 9/6232* (2013.01); *G06T 7/0085* (2013.01); *G06T 7/204* (2013.01); *G06T 7/206* (2013.01); *H03M 7/3062* (2013.01); *G06T 2207/10016* (2013.01); *G06T 2207/30232* (2013.01); *G06T 2207/30241* (2013.01)

(56) References Cited

U.S. PATENT DOCUMENTS

| | | | |
|---|---|---|---|
| 5,166,788 | A | 11/1992 | Lee |
| 5,262,854 | A | 11/1993 | Ng |
| 5,555,023 | A | 9/1996 | Maenaka et al. |
| 5,572,552 | A | 11/1996 | Dent et al. |
| 5,870,144 | A | 2/1999 | Guerrera |
| 5,983,251 | A | 11/1999 | Martens et al. |
| 6,148,107 | A | 11/2000 | Ducloux et al. |
| 6,356,324 | B1 | 3/2002 | Nishiguchi et al. |
| 6,718,287 | B2 | 4/2004 | Oostveen et al. |
| 6,806,903 | B1 | 10/2004 | Okisu et al. |
| 6,954,501 | B2 | 10/2005 | Skripin et al. |
| 7,046,853 | B2 | 5/2006 | Okada |
| 7,227,895 | B1 | 6/2007 | Wang et al. |
| 7,345,603 | B1 | 3/2008 | Wood et al. |
| 7,680,356 | B2 | 3/2010 | Boyce et al. |
| 8,125,883 | B2 | 2/2012 | Aulin |
| 8,204,126 | B2 | 6/2012 | Tsuda et al. |
| 2002/0181789 | A1 | 12/2002 | Okada |
| 2003/0017816 | A1 | 1/2003 | Souetinov |
| 2003/0043918 | A1 | 3/2003 | Jiang et al. |
| 2003/0152147 | A1 | 8/2003 | Akimoto et al. |
| 2003/0197898 | A1 | 10/2003 | Battiato et al. |
| 2004/0264580 | A1 | 12/2004 | Chiang Wei Yin et al. |
| 2005/0207498 | A1 | 9/2005 | Vitali et al. |
| 2006/0203904 | A1 | 9/2006 | Lee |
| 2006/0239336 | A1 | 10/2006 | Baraniuk et al. |
| 2007/0047838 | A1 | 3/2007 | Milanfar et al. |
| 2007/0242746 | A1 | 10/2007 | Kishimoto et al. |
| 2007/0285554 | A1 | 12/2007 | Givon |
| 2008/0025624 | A1 | 1/2008 | Brady |
| 2008/0117968 | A1 | 5/2008 | Wang |
| 2008/0130883 | A1 | 6/2008 | Agaian et al. |
| 2008/0152296 | A1 | 6/2008 | Oh et al. |
| 2009/0010337 | A1 | 1/2009 | Wang |
| 2009/0010338 | A1 | 1/2009 | Wang |
| 2009/0052585 | A1 | 2/2009 | Song et al. |
| 2009/0222226 | A1 | 9/2009 | Baraniuk et al. |
| 2009/0316779 | A1 | 12/2009 | Fukuhara et al. |
| 2010/0027897 | A1 | 2/2010 | Sole et al. |
| 2010/0040299 | A1 | 2/2010 | Noh et al. |
| 2010/0091134 | A1 | 4/2010 | Cooke et al. |
| 2010/0165163 | A1 | 7/2010 | Matsuda |
| 2010/0189172 | A1 | 7/2010 | Pateux et al. |
| 2010/0246952 | A1 | 9/2010 | Banner et al. |
| 2011/0096833 | A1 | 4/2011 | Wang et al. |
| 2011/0150084 | A1 | 6/2011 | Choi et al. |
| 2011/0150087 | A1 | 6/2011 | Kim et al. |
| 2011/0276612 | A1 | 11/2011 | Droz et al. |
| 2011/0310972 | A1 | 12/2011 | Wang et al. |
| 2012/0051432 | A1 | 3/2012 | Fernandes et al. |
| 2012/0063641 | A1 | 3/2012 | Venkatesh et al. |
| 2012/0082208 | A1 | 4/2012 | Jiang et al. |
| 2012/0114039 | A1 | 5/2012 | Wang |
| 2012/0189047 | A1 | 7/2012 | Jiang et al. |
| 2013/0121422 | A1 | 5/2013 | Jiang et al. |
| 2014/0043491 | A1 | 2/2014 | Jiang et al. |
| 2015/0178945 | A1* | 6/2015 | Haimi-Cohen .... G06K 9/00771 382/107 |
| 2016/0021390 | A1* | 1/2016 | Haimi-Cohen ...... H04N 19/139 375/240.24 |

FOREIGN PATENT DOCUMENTS

| | | |
|---|---|---|
| CN | 102025999 | 4/2011 |
| JP | 2003069832 A | 3/2003 |
| WO | WO 2011/081643 | 7/2011 |

OTHER PUBLICATIONS

Office Action dated Apr. 14, 2014 in related U.S. Appl. No. 12/894,807.
Notice of Allowance dated Apr. 17, 2014 in related U.S. Appl. No. 12/894,757.
Office Action issued in co-pending U.S. Appl. No. 13/182,856 on Feb. 13, 2014.
Translation of Japanese Office Action dated Feb. 25, 2014 in Japanese Application No. 2013-531973, which corresponds to co-pending U.S. Appl. No. 12/894,807.
Office Action dated Jul. 9, 2014 in co-pending U.S. Appl. No. 13/213,762.
Office Action dated Aug. 27, 2014 in copending U.S. Appl. No. 13/182,856.
Notice of Allowance dated Sep. 12, 2014 in copending U.S. Appl. No. 12/894,757.
Office Action dated Oct. 24, 2014 in related U.S. Appl. No. 12/894,807.
International Search Report mailed Feb. 26, 2015 for International Application No. PCT/US2014/066035.
Narayanan, Sathiya et al., "Camera Motion Estimation Using Circulant Compressive Sensing Matrices", 2013 $9^{th}$ International Conference on Information, Communications & Signal Processing, IEEE, Dec. 10, 2013, pp. 1-5, XP032584530.
Majumdar, Angshul, "A sparsity based approach towards fast MRI acquisition", Jul. 19, 2012 (XP055123105).
Willett, Rebecca M. et al., "Compressed sensing for practical optical imaging systems: a tutorial", SPIE, Optical Engineering, vol. 50, No. 7, Jul. 6, 2011, pp. 1-13, XP040561676.
Jun. 4, 2015 U.S. Office Action issued in related U.S. Appl. No. 13/213,762.
Jun. 3, 2015 Chinese Office Action issued in corresponding Chinese Application No. 201180047658.2.
U.S. Final Office Action dated Oct. 5, 2015, for U.S. Appl. No. 12/894,807.
Office Action issued in U.S. Appl. No. 12/894,855 on Oct. 1, 2012.
Office Action issued in U.S. Appl. No. 12/894,807 on Nov. 21, 2012.
Office Action issued in U.S. Appl. No. 12/894,757 on Dec. 4, 2012.
Office Action issued in U.S. Appl. No. 12/894,855 on Mar. 4, 2013.
Office Action issued in U.S. Appl. No. 12/894,757 on Mar. 20, 2013.
Office Action issued in U.S. Appl. No. 12/894,807 dated May 13, 2013.
Office Action issued in U.S. Appl. No. 13/182,856 on Aug. 16, 2013.
International Search Report for PCT/US2011/056088 dated Feb. 26, 2012.
International Search Report for PCT/US2011/051726 dated Nov. 14, 2011.
International Search Report for PCT/US2011/051730 dated Dec. 15, 2011.
International Preliminary Report on Patentability for PCT/US2011/051726 dated Apr. 2, 2013.
Written Opinion for PCT/US2011/051726 dated Nov. 14, 2011.
Written Opinion for PCT/US2011/051730 dated Dec. 15, 2011.
International Preliminary Report on Patentability for PCT/US2011/051730 dated Apr. 2, 2013.
International Preliminary Report on Patentability PCT/US2011/056088 dated Apr. 2, 2013.
Written Opinion for PCT/US2011/056088 dated Feb. 29, 2012.

(56) References Cited

OTHER PUBLICATIONS

CCD and CMOS sensor technology, 2010 Axis Communications, pp. 1-8.
Jan Bogaerts et al., "High-End CMOS Active Pixel Sensors for Space-Borne Imaging Instruments," 2005, FillFactory. pp. 1-9.
Roger William Dering, "A Tricolor Digital/Micromirror Video Chip", 2001, UCLA, pp. 1-180.
Tarek Ouni et al., "New low complexity DCT based video compression method", 2009, ICT 09, pp. 202-207.
R. Turchetta et al., "Monolithic active pixel sensor (MAPS) in VLSI CMOS technology", 2003, Science Direct, pp. 1-9.
Sahng-Gyu Partk, Adaptive Lossless Video Compression, 2003, Purdue University, pp. 1-105.
Dugad, R. et al., "A Fast Scheme for Image Size Change in the Compressed Domain," IEEE Transactions on Circuits and Systems for Video Technology, vol. 11, No. 4, Apr. 1, 2011.
Deng, C. et al., "Robust image compression based on compressive sensing," Multimedia and Expo (ICME), Jul. 19, 2012, 462-467.
Hyder, M. et al. "A Scalable Distributed Video Coder Using compressed Sensing," India Conference, Dec. 8, 2009, pp. 1-4.
Gao, D. et al., "A Robust Image Transmission Scheme for Wireless Channels Based on Compressive Sensing," Aug. 18, 2012, pp. 334-341.
Robucci, Ryan, et al., "Compressive Sensing on a CMOS Seperable Transform Image Sensor," pp.5125-5128, IEEE, 2008.
Cossalter M. et al., "Joint Compressive Video Coding and Analyss," IEEE Transactions on Multimedia, IEEE Service Center, Piscataway, NJ, US, vol. 12, No. 3, Apr. 1, 2010, pp. 168-183.
Dadkhan M.R. et al., "Compressive Sensing with Modified Total Variation Minimization Algorithm," Acoustic Speech and Signal Processing (ICASSP), 2010 IEEE International Conference ON, IEEE, Piscataway, NJ, USA, Mar. 14, 2010, pp. 1310-1313.
Huihui Bai et al., "Compressive Sensing for DCT Image," Computational Aspects of Social Networks (CASON), 2010 International Conference ON, IEEE, Piscataway, NJ, USA, Sep. 26, 2010, pp. 378-381.
Duarte M.F. et al., "Single-Pixel Imaging via Compressive Sampling," IEEE Signal Processing Magazine, IEEE Service Center, Piscataway, NJ, US, vol. 25, No. 2, Mar. 1, 2008, pp. 83-91.
Chengbo Li, "An Efficient Algorithm for Total Variation Regularization with Applications to the Single Pixel Camera and Compressive Sensing," Thesis Submitted in Partial Fulfillment of the Requirements for the Degree Master of Arts, Sep. 30, 2009, pp. 1-93, Retrieved from the internet: URL:http://scholarship.rice.edu/bitstream/handle/1911/62229/1486057.PDF?sequence=1 [Retrieved Oct. 31, 2011]
Chengbo Li et al., "Video Coding Using Compressive Sensing for Wireless Communications," Wireless Communications and Networking Conference (WCNC), 2011 IEEE, IEEE, Mar. 28, 2011, pp. 2077-2082.
Hong Jiang et al., "Arbitrary Resolution Video Coding Using Compressive Sensing," Workshop on Picture Coding and Image Processing 2010, Dec. 7, 2010.
Park and Wakin, "A multiscale framework for compressive sensing of video," in Picture Coding Simposium, Chicago, IL, May 2009.
Drori, Iddo, "Compressed Video Sensing", BMVA symposium on 3D video analysis, display, and applications, 2008.
Wakin et al., "Compressive imaging for video representation and coding", in Picture Coding Symposium, (Beijing, China), Apr. 2006.
L.R. Rabiner and B. Gold, Theory and Application of Digital Signal Processing, ch. 6, sec. 6.17, pp. 393-399. Prentice Hall, 1975.
Huang, Gang et al. "Lensless Compressive Sensing Imaging," Jan. 2013, pp. 1-12.
Office Action dated Jun. 18, 2014 in related U.S. Appl. No. 13/213,743.

* cited by examiner

METHODS AND APPARATUSES FOR DETECTING ANOMALIES IN THE COMPRESSED SENSING DOMAIN

BACKGROUND

Security and monitoring applications may employ a network of surveillance video cameras. Typically, the security and monitoring applications are used to detect anomalies in video data, which may require monitoring the networked cameras in real-time. Monitoring the networked cameras in real-time often requires transmission of captured video data from the networked cameras to a control center.

The transmission of captured video data or a video stream in real-time usually requires compressing the captured video data, transmitting the compressed video data, decompressing the video data in real-time, and reconstructing the decompressed video data for display. Additionally, a human operator is often required to watch the reconstructed video data continuously in order to detect an anomaly in the video data.

However, in many security and monitoring applications, hundreds or thousands of video streams may need to be compressed, decompressed, reconstructed, and observed by one or more human operators. One issue with such security and monitoring applications is that they may require relatively large amounts of network and/or computing resources in order to compress/decompress/reconstruct the numerous video streams. Another issue is that there may be prohibitive cost of employing a large number of human operators, which may lead to some video stream partially or completely unobserved. Additionally, some anomalies may go undetected due to operator fatigue and/or other like human errors in observing the reconstructed video streams.

SUMMARY

At least one example embodiment relates to a method for processing a source signal, or alternatively video data.

According to an example embodiment, a method for processing a source signal to detect anomalies is provided. The method includes receiving a measurement vector of compressive measurements. The measurement vector may be derived by applying a sensing matrix to a source signal. The method includes generating at least one first feature vector from the measurement vector. The first feature vector may be an estimate of a second feature vector. The second feature vector may be a feature vector that corresponds to a translation of the source signal. The method includes detecting an anomaly in the source signal based on the first feature vector.

In one example embodiment, the generating the at least one first feature vector is done without reconstructing the source signal.

In one example embodiment, the generating includes computing linear combinations of the at least one first feature vector.

In one example embodiment, more than one first feature vectors are generated, each of the first feature vectors have a corresponding translation parameter, and the method further includes comparing elements of a set of the first feature vectors with other elements of the set of first feature vectors, and determining which elements are similar to each other.

In one example embodiment, the sensing matrix is derived from a circulant matrix such that the sensing matrix contains a row that is obtained by shifting a different row in the sensing matrix.

In one example embodiment, the source signal is multi-dimensional and the translation parameter includes translations in one or more dimensions.

In one example embodiment, the source signal is obtained from one or more image frames.

In one example embodiment, the method further includes performing edge detection by generating a linear combination of the at least one first feature vector. The performing corresponds to subtracting a linear combination of neighboring pixels from pixels in the source signal.

In one example embodiment, the processing of the source signal includes detecting motion in the one or more image frames.

In one example embodiment, more than one first feature vectors are generated, each of the first feature vectors have a corresponding translation parameter, and the method further includes comparing elements of a set of the first feature vectors with other elements of the set of first feature vectors, and determining which elements are similar to each other.

In one example embodiment, the method further includes determining at least one of a speed of the detected motion, a direction of the detected motion, and a certainty of the detected motion. The determining may be based on at least one of (i) the translation parameters associated with the elements determined to be similar to each other, and (ii) a degree of similarity of the elements determined to be similar to each other.

In one example embodiment, the detected motion triggers an action if the detected motion meets at least one criterion According to an example embodiment, a method for obtaining a measurement vector for processing a source signal to detect anomalies is provided. The method includes generating a measurement vector by applying a sensing matrix to a source signal. The sensing matrix may be a shift-preserving sensing matrix. The measurement vector may be used to detect anomalies in the source signal.

In one example embodiment, the source signal is multi-dimensional.

In one example embodiment, the source signal is obtained from one or more images.

In one example embodiment, one or more images are derived by applying a windowing function to one or more original images.

In one example embodiment, the one or more images are a video signal.

At least one example embodiment relates to a server for processing a source signal, or alternatively video data.

According to an example embodiment, a server for processing a source signal to detect anomalies is provided. The server is configured to receive a measurement vector. The measurement vector may be derived by applying a sensing matrix to a source signal. The server is configured to generate at least one first feature vector from the measurement vector. The first feature vector may be an estimate of a second feature vector, and the second feature vector may be a feature vector that corresponds to a translation of the source signal. The server is configured to detect an anomaly in the source signal based on the first feature vector.

According to another example embodiment, an image detection device for obtaining a measurement vector for processing a source signal to detect anomalies is provided. The image detection device is configured to generate a set of compressive measurements by applying a sensing matrix to a source signal. The sensing matrix may be a shift-preserving sensing matrix. The image detection device is configured to generate a measurement vector based on the set of compressive measurements. The measurement vector may be used to detect anomalies in the source signal.

According to another example embodiment, an image detection system for detect anomalies is provided. The image detection system includes an image detection device for obtaining compressive measurements for processing the source signal and a server for processing the source signal. The image detection device is configured to generate a set of compressive measurements by applying a sensing matrix to a source signal. The image detection device is configured to generate a measurement vector based on the set of compressive measurements. The server is configured to receive the measurement vector. The server is configured to generate at least one first feature vector from the measurement vector. The first feature vector may be an estimate of a second feature vector, and the second feature vector may be a feature vector that corresponds to a translation of the source signal. The server is configured to detect an anomaly in the source signal based on the first feature vector.

At least one example embodiment relates to program code adapted to perform one or more of the example embodiments of as described above.

At least one example embodiment relates a computer readable storage medium comprising instructions that, when executed by a data processing apparatus, cause the data processing apparatus to perform one or more methods of the example embodiments as described above.

BRIEF SUMMARY OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF THE EMBODIMENTS

Figure 1:
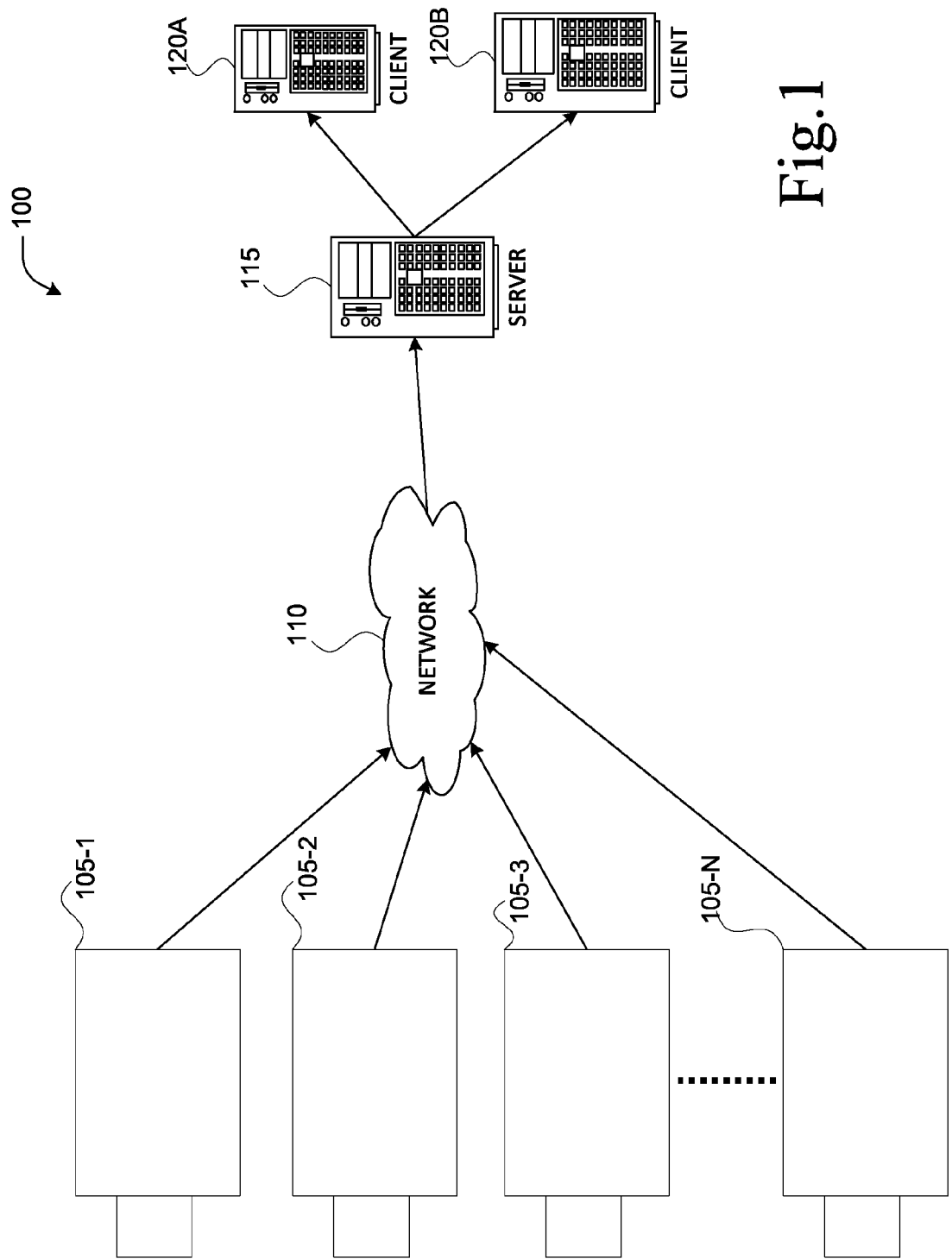
FIG. 1 illustrates an example of a communications network, according to an example embodiment.

Various example embodiments will now be described more fully with reference to the accompanying drawings in which some example embodiments of the invention are shown.

Detailed illustrative embodiments are disclosed herein. However, specific structural and functional details disclosed herein are merely representative for purposes of describing example embodiments of the present invention. However, embodiments may be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams in order not to obscure the example embodiments in unnecessary detail. In other instances, well-known processes, structures and techniques may be shown without unnecessary detail in order to avoid obscuring example embodiments.

Also, it is noted that example embodiments may be described as a process depicted as a flowchart, a flow diagram, a data flow diagram, a structure diagram, or a block diagram. Although a flowchart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, a function, a procedure, a subroutine, a subprogram, etc. When a process corresponds to a function, its termination may correspond to a return of the function to the calling function or the main function.

Moreover, as disclosed herein, the term "memory" may represent one or more devices for storing data, including random access memory (RAM), magnetic RAM, core memory, and/or other machine readable mediums for storing information. The term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "computer-readable medium" may include, but is not limited to, portable or fixed storage devices, optical storage devices, wireless channels, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a storage medium. A processor(s) may perform the necessary tasks.

A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

As used herein, the term "client device" may be considered synonymous to, and may hereafter be occasionally referred to, as a client, terminal, user terminal, mobile terminal, mobile, mobile unit, mobile station, mobile user, UE, subscriber, user, remote station, access agent, user agent, receiver, etc., and may describe a remote user of network resources in a communications network. Furthermore, the term "client" may include any type of wireless/wired device such as consumer electronics devices, desktop computers, laptop computers, smart phones, tablet personal computers, and personal digital assistants (PDAs), for example.

As used herein, the term "network element", may be considered synonymous to and/or referred to as a networked computer, networking hardware, network equipment, server, router, switch, hub, bridge, gateway, or other like device. The term "network element" may describe a physical computing device of a wired or wireless communication network and configured to host a virtual machine. Furthermore, the term "network element" may describe equipment that provides radio baseband functions for data and/or voice connectivity between a network and one or more users.

Exemplary embodiments are discussed herein as being implemented in a suitable computing environment. Although not required, exemplary embodiments will be described in the general context of computer-executable instructions, such as program modules or functional processes, being executed by one or more computer processors (CPUs). Generally, program modules or functional processes include routines, programs, objects, components, data structures, etc. that performs particular tasks or implement particular data types. The program modules and functional processes discussed herein may be implemented using existing hardware in existing communication networks. For example, program modules and functional processes discussed herein may be implemented using existing hardware at existing network elements or control nodes (e.g., server 115 as shown in FIG. 1). Such existing hardware may include one or more digital signal processors (DSPs), graphics processing units (GPUs), application-specific-integrated-circuits, field programmable gate arrays (FPGAs) computers or the like. In various embodiments, the operation of program modules and/or functional processes may be performed by analog computing devices, where variables of interest may be represented by physical quantities, such as light intensity and/or voltage. Furthermore, in such embodiments, the computation may be performed by analog computing devices, such as, electro-optical devices and the like.

Example embodiments provide methods and systems for detecting anomalies in video data without involving a human operator and/or without requiring an excessive amount of computational and/or network resources. Additionally, example embodiments provide methods and systems for detecting anomalies in compressed video data without reconstructing the compressed video data.

Anomalies may be characterized as any deviation, departure, or change from a normal and/or common order, arrangement, and/or form. In a source signal and/or video data, an anomaly may be defined as any difference between two or more images, video frames, and/or other like data structure. For example, in a network of cameras monitoring a crossroad and/or intersection of streets, an anomaly may be defined as any change in an image or video frame that is detected by the network of cameras, which is different than one or more other images or video frames. In various embodiments, anomalies may be characterized as a motion and/or movement in a location and/or position, where no movement should be present. Additionally, an anomaly may be characterized as an unexpected motion and/or movement in a desired location and/or position, where a desired motion usually occurs. For example, in a network of cameras monitoring a crossroad and/or intersection of streets, an anomaly may be defined as motion in a direction that is not allowed by traffic laws at the intersection, a speed of a vehicle at the intersection above a desired threshold, and/or a motion that is outside a desired boundary or boundaries of the streets.

Furthermore, "anomaly detection" may be characterized as any form of recognizing, characterizing, extracting, or otherwise discovering any information about an anomaly. In various embodiments, anomaly detection may include determining that an anomaly exists, estimating a likelihood and/or probability that an anomaly exists, and/or ascertaining or otherwise discovering information about an anomaly or estimated anomaly (e.g., a location, direction, and/or speed of one or more moving objects).

FIG. 1 illustrates an example of a communications network 100, according to an example embodiment. The communications network 100 includes motion detection devices 105-1-105-N, network 110, server 115, and client devices 120A-B.

Each of the motion detection devices 105-1-105-N (where N≤1) (hereinafter referred to as "motion detection devices 105") 105 may include a transceiver, memory, and processor. Motion detection devices 105 may be configured to send/receive data to/from server 115. Motion detection devices 105 may be designed to sequentially and automatically carry out a sequence of arithmetic or logical operations; equipped to record/store digital data on a machine readable medium; and transmit and receive digital data via network 110. Motion detection devices 105 may be any image and/or motion capture device, such as a digital camera, a lens-less image capture device, and/or any other physical or logical device capable of capturing, recording, storing, and/or transferring captured video data via network 110. Each of the motion detection devices 105 may include a wired transmitter or a wireless transmitter configured to operate in accordance with wireless communications standards, such as CDMA, GSM, LTE, WiMAX, or other like wireless communications standards.

Each of the motion detection devices 105 may be configured to encode and/or compress captured video data (or alternatively, a "video stream") using compressive sensing (or alternatively, compressed sensing, compressive sampling, or sparse sampling). Compressive sensing is a signal processing technique that allows an entire signal to be determined from relatively few measurements. Compressive sensing includes applying a sensing matrix (often referred to as a measurement matrix) to a source signal and obtaining a set of measurements (often referred to as a measurement vector). The sensing matrix may include a pattern of assigned values. The pattern of assigned values of the sensing matrix may be constructed using a fast transform matrix, such as a Walsh-Hadamard matrix, a circulant matrix, and/or any other like matrix. Additionally, in various embodiments, compressive measurements may be generated by spatial-temporal integration, as described in co-pending U.S. application Ser. No. 12/894,855, co-pending U.S. application Ser. No. 13/213,743, and/or co-pending U.S. application Ser. No. 13/182,856 which are each hereby incorporated by reference in their entirety.

Network 110 may be any network that allows computers to exchange data. Network 110 may include one or more network elements (not shown) capable of physically or logically connecting computers. In various embodiments, network 110 may be the Internet. In various embodiments, network 110 may be may be a Wide Area Network (WAN) or other like network that covers a broad area, such as a personal area network (PAN), local area network (LAN), campus area network (CAN), metropolitan area network (MAN), a virtual local area network (VLAN), or other like networks capable of physically or logically connecting computers. Additionally, in various embodiments, network 110 may be a private and/or secure network, which is used by a single organization (e.g., a business, a school, a government agency, and the like).

Server 115 is a network element that may include one or more systems and/or applications for processing a source signal (e.g., a signal captured by at least one of the motion detection devices 105) for anomaly detection in the source signal. Server 115 may include a processor, memory or computer readable storage medium, and a network interface. In some embodiments, server 115 may include a transmitter/receiver connected to one or more antennas. The server 115 may be any network element capable of receiving and responding to requests from one or more client devices (e.g., clients 120A-B) across a computer network (e.g., network 110) to provide one or more services. Accordingly, server 115 may be configured to communicate with the motion detection devices 105 and clients 120A-B via a wired or wireless protocol. Additionally, server 115 may be a single physical hardware device, or server 115 may be physically or logically connected with other network devices, such that the server 115 may reside on one or more physical hardware devices.

In various embodiments, server 115 is configured to operate an anomaly determination algorithm and/or routine. According to various embodiments, server 115 may be configured to receive one or more source signals and/or video streams, as measured and/or recorded by the motion detection devices 105, and determine and/or detect an anomaly in the source signal and/or video stream. In such embodiments, server 115 may also be configured to notify one or more client devices (e.g., clients 120A-B) when an anomaly has been detected by issuing a flag, or otherwise indicating, that an anomaly has been detected.

Client devices 120A-B may be a hardware computing device capable of communicating with a server (e.g., server 115), such that client devices 120A-B are able to receive services from the server. Client devices 120A-B may include memory, one or more processors, and (optionally) transceiver. Client devices 120A-B may be configured to send/receive data to/from network devices, such as a router, switch, or other like network devices, via a wired or wireless connection. Client devices 120A-B may be designed to sequentially and automatically carry out a sequence of arithmetic or logical operations; equipped to record/store digital data on a machine readable medium; and transmit and receive digital data via one or more network devices. Client devices 120A-B may include devices such as desktop computers, laptop computers, cellular phones, tablet personal computers, and/or any other physical or logical device capable of recording, storing, and/or transferring digital data via a connection to a network device. Client devices 120A-B may include a wireless transceiver configured to operate in accordance with one or more wireless standards.

As shown in FIG. 1, only two client devices 120A-B and a single server 115 are present. According to various embodiments, multiple client devices, multiple servers, and/or any number of databases (not shown) may be present. Additionally, in some embodiments, client devices 120A-B and server 115 may be virtual machines, and/or they may be provided as part of a cloud computing service. In various embodiments, client devices 120A-B and server 115 may reside on one physical hardware device, and/or may be otherwise fully integrated with one another, such that, in various embodiments, one or more operations that are performed by server 115 may be performed by client devices 120A-B.

Figure 2:
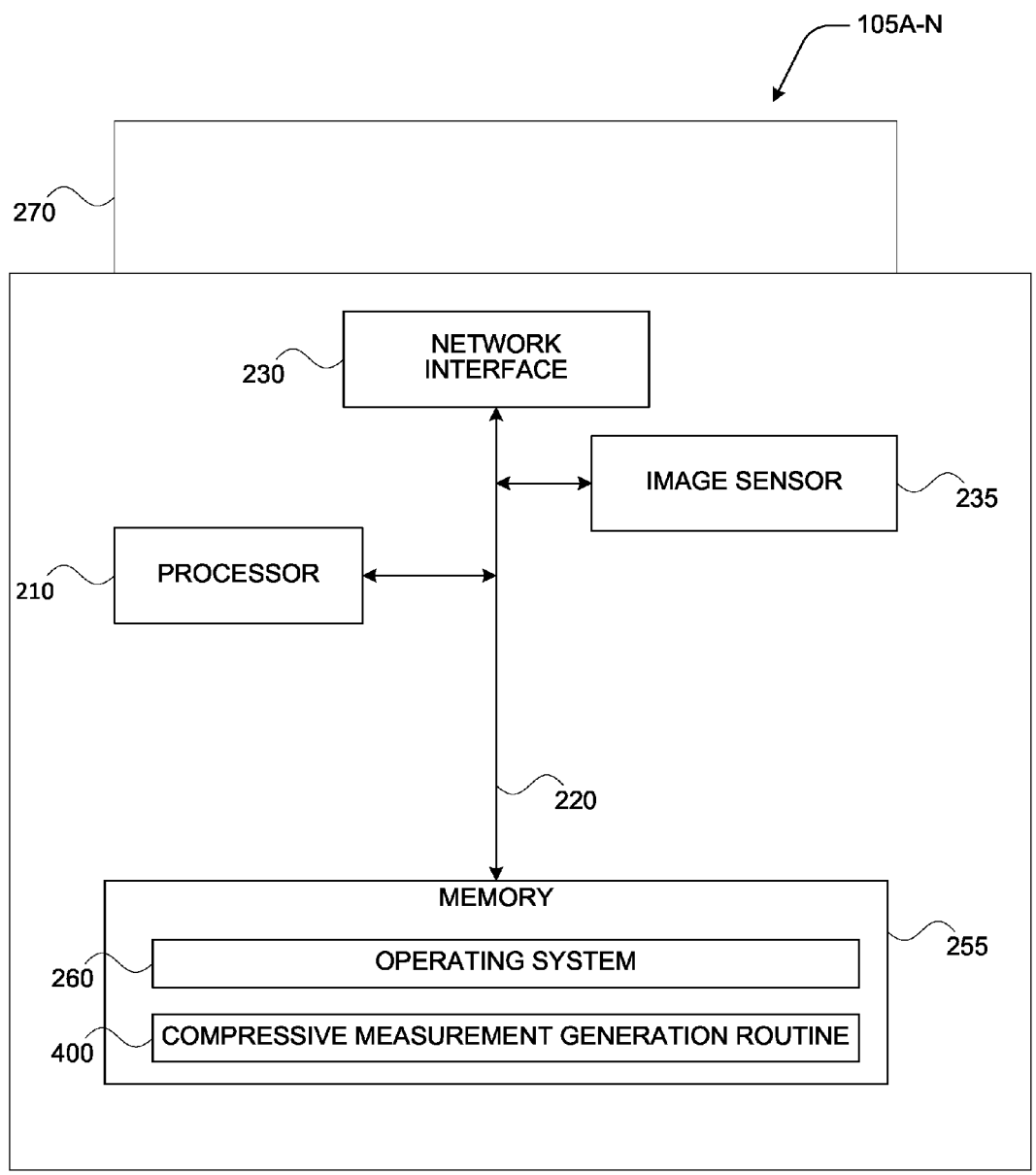
FIG. 2 illustrates the components of a motion detection device being employed by the communication network of FIG. 1, according to an example embodiment.

FIG. 2 illustrates the components of motion detection device 105 being employed by communications network 100, according to an example embodiment. As shown, the motion detection device 105 includes processor 210, bus 220, network interface 230, memory 255, and image capture mechanism 270. During operation, memory 255 includes operating system 260, and compressive measurement generation routine 400. In some embodiments, the motion detection device 105 may include many more components than those shown in FIG. 2. However, it is not necessary that all of these generally conventional components be shown in order to understand the illustrative embodiment. Additionally, it should be noted that any one of the motion detection devices 105 may have the same or similar components as shown in FIG. 2

Memory 255 may be a computer readable storage medium that generally includes a random access memory (RAM), read only memory (ROM), and/or a permanent mass storage device, such as a disk drive. Memory 255 also stores operating system 260 and program code for compressive measurement generation routine 400. These software modules may also be loaded from a separate computer readable storage medium into memory 255 using a drive mechanism (not shown). Such separate computer readable storage medium may include a floppy drive, disc, tape, DVD/CD-ROM drive, memory card, or other like computer readable storage medium (not shown). In some embodiments, software modules may be loaded into memory 255 via network interface 230, rather than via a computer readable storage medium.

Processor 210 may be configured to carry out instructions of a computer program by performing the basic arithmetical, logical, and input/output operations of the system. Instructions may be provided to processor 210 by memory 255 via bus 220. In various embodiments, processor 210 is configured to encode and/or compress a source signal and/or captured video data using compressive sensing. Additionally, processor 210 is configured to generate a set of compressive measurements based on the compressive sensing. In such embodiments, the compressive measurements may be generated using spatial-temporal integration, as described above with regard to FIG. 1, and/or as described in co-pending U.S. application Ser. No. 12/894,855, co-pending U.S. application Ser. No. 13/213,743, and/or co-pending U.S. application Ser. No. 13/182,856 which are each incorporated by reference in their entirety.

Bus 220 enables the communication and data transfer between the components of the motion detection device 105. Bus 220 may comprise a high-speed serial bus, parallel bus, storage area network (SAN), and/or other suitable communication technology.

Network interface 230 is a computer hardware component that connects the motion detection device 105 to a computer network. Network interface 230 may connect the motion detection device 105 to a computer network via a wired or wireless connection. Accordingly, motion detection device 105 may be configured to communicate with one or more servers (e.g., server 115) via the network interface 230.

Image capture mechanism 270 includes any mechanism for acquiring video data. Image capture mechanism 270 may include an optical lens, an image sensor (e.g., a charge-coupled device (CCD), a complementary metal-oxide-semiconductor (CMOS) sensor chip, active-pixel sensor (APS), and the like), and/or any like device that is capable of turning light into electrical and/or digital signals.

In some embodiments, at least some of the functionality of the processor 210 may be incorporated into the image sensor 235. For example, image capture mechanism 270 may include a lens-less image capture mechanism. Some lens-less image capture mechanisms may include an aperture assembly and a sensor. The aperture assembly may include a two dimensional array of aperture elements, and the sensor may be a single detection element, such as a single photo-conductive cell. Each aperture element together with the sensor may define a cone of a bundle of rays, and the cones of the aperture assembly define the pixels of an image. Each combination of pixel values of an image, defined by the bundle of rays, may correspond to a row in a sensing matrix. The integration of the bundle of rays in a cone by the sensor may be used for taking compressive measurements, without computing the pixels. In such embodiments, the lens-less camera may perform the functionality of the image sensor 235 and some of the functionality of the processor 210.

It should be noted that, although an example of a lens-less image capture mechanism is described above, any type of lens-less image capture mechanism may be used. Additionally, although FIG. 2 shows that image capture mechanism 270 is attached to motion detection device 105, in some embodiments image capture mechanism 270 may be a separate device that is connected to the other components of the motion detection device 105.

Figure 3:
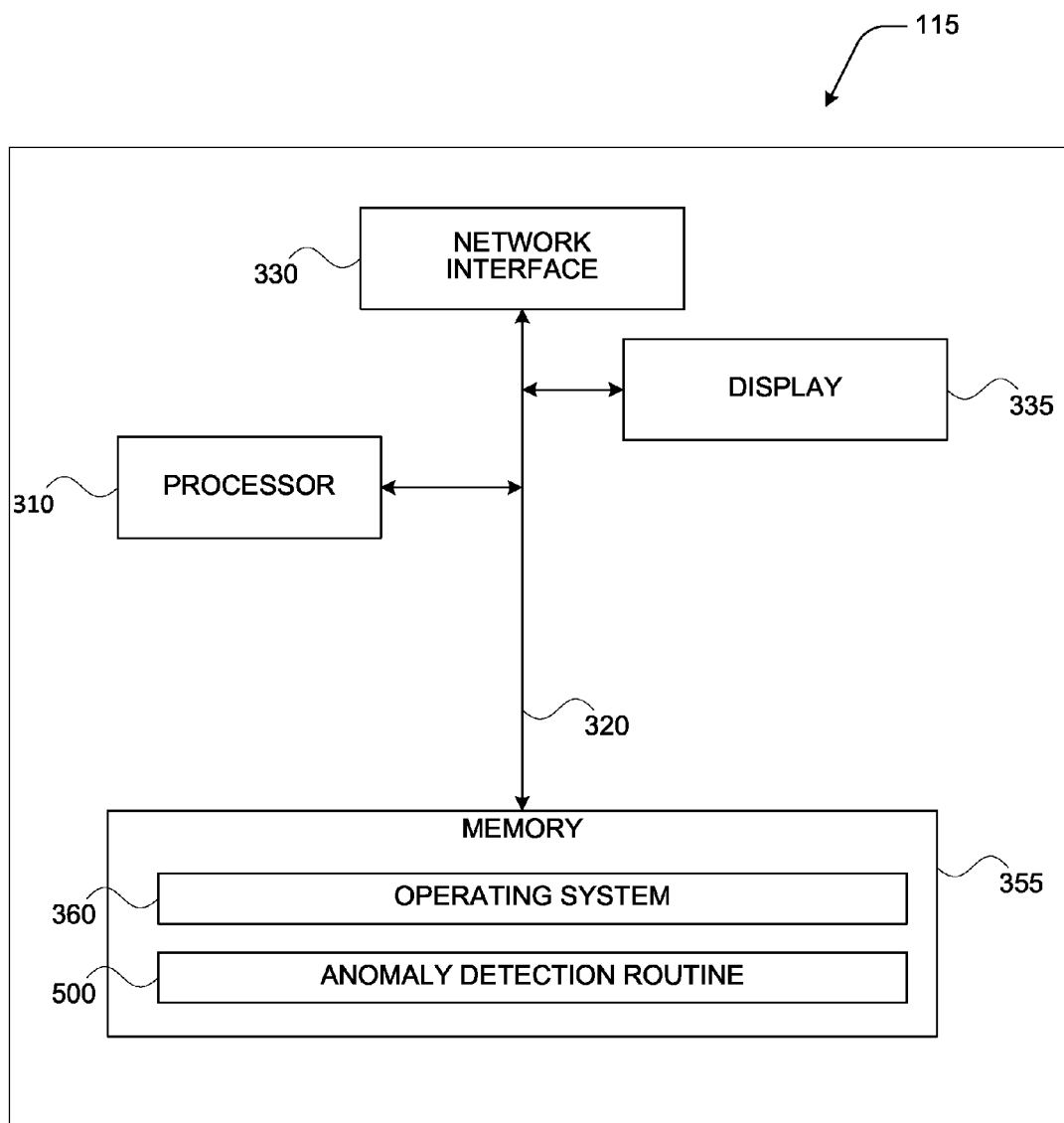
FIG. 3 illustrates the components of a signal processing server being employed by the communication network of FIG. 1, according to an example embodiment.

FIG. 3 illustrates the components of server 115 being employed by communications network 100, according to an example embodiment. As shown, the server 115 includes processor 310, bus 320, network interface 330, display 335, and memory 355. During operation, memory 355 includes operating system 360 and anomaly detection routine 500. In some embodiments, the server 115 may include many more components than those shown in FIG. 3. However, it is not necessary that all of these generally conventional components be shown in order to understand the illustrative embodiment.

Memory 355 may be a computer readable storage medium that generally includes a random access memory (RAM), read only memory (ROM), and/or a permanent mass storage device, such as a disk drive. Memory 355 also stores operating system 360 and anomaly detection routine 500. In various embodiments, the memory 355 may include an edge detection routine (not shown). These software modules may also be loaded from a separate computer readable storage medium into memory 355 using a drive mechanism (not shown). Such separate computer readable storage medium may include a floppy drive, disc, tape, DVD/CD-ROM drive, memory card, or other like computer readable storage medium (not shown). In some embodiments, software modules may be loaded into memory 355 via network interface 330, rather than via a computer readable storage medium.

Processor 310 may be configured to carry out instructions of a computer program by performing the basic arithmetical, logical, and input/output operations of the system. Instructions may be provided to processor 310 by memory 355 via bus 320.

Bus 320 enables the communication and data transfer between the components of the server 115. Bus 320 may comprise a high-speed serial bus, parallel bus, storage area network (SAN), and/or other suitable communication technology.

Network interface 330 is a computer hardware component that connects the server 115 to a computer network. Network interface 330 may connect the server 115 to a computer network via a wired or wireless connection. Accordingly, server 115 may be configured to communicate with one or more serving base stations via the network interface 330.

It should be noted that in various embodiments, the motion detection devices 105 and the server 110 may be integrated into one unit, such that both the motion detection devices 105 and the server 110 may reside on one physical hardware device. In such embodiments, the components of the motion detection devices 105 and the server 110 as shown in FIGS. 2 and 3, respectively, may be provided by a single component, such as a single processor, a single memory, and the like. Additionally, in such embodiments, some of the components of the motion detection devices 105 and the server 110 may not be required, such as a network interface for communicating over a network.

Figure 4:
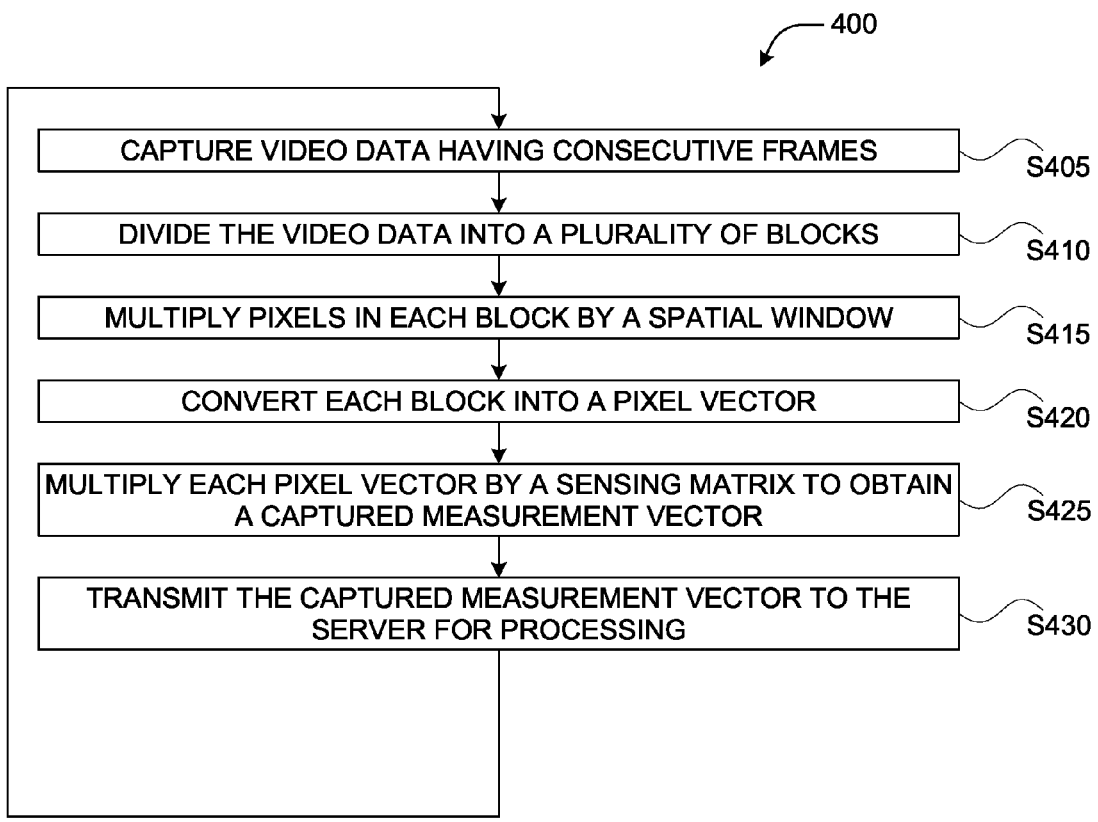
FIG. 4 shows a compressive measurement generation routine, according to an example embodiment.

FIG. 4 shows a compressive measurement generation routine 400, according to an example embodiment. Compressive measurement generation routine 400 may be used to generate a set of measurements, which represent captured signals and/or video data, for encoding and/or compressing. For illustrative purposes, the operations of compressive measurement generation routine 400 will be described as being performed by the motion detection device 105 as described above with respect to FIG. 2. However, it should be noted that other similar image capture devices may operate the compressive measurement generation routine 400 as described below.

Referring to FIG. 4, as shown in operation S405, the motion detection device 105 captures video data having consecutive frames. As discussed above, the motion detection device 105 includes an image capture mechanism (e.g., image capture mechanism 270) configured to capture video data and/or a source signal. Thus, in operation S405, the motion detection device 105 captures video data using an associated image capture mechanism. This may also be referred to as the "original video".

A signal of length N may be represented by:

$$x=[x(0), \ldots, x(N-1)]^T \quad \text{[equation 1]}$$

A translation of x by a shift d is a signal $\tilde{x}=T^d x=[\tilde{x}(0), \ldots, \tilde{x}(N-1)]^T$ where $\tilde{x}(n)=x(n-d)$. Points and/or portions of the translation signal whose indices correspond to indices of the original signal, which are out of the original signal's defined domain, may be referred to as "out-of-domain cases". Out-of-domain cases may exist where n−d<0 or n−d≥N. For example, x(n−d) may be defined as zero in the edge cases. Alternatively, the signal may be extended in a periodic manner, as shown in equation 2:

$$x(n-d)=x(n-d \bmod(N)) \quad \text{[equation 2]}$$

In equation 2, n−d mod(N) is the integer 0≤k<N such that n−d−k is divisible by N. If the signal x is a multi-dimensional signal, the shift parameter d becomes a vector, where each component represents a shift in a particular dimension. In various embodiments, multi-dimensional signals may be serialized into one-dimensional (1D) vectors prior to processing. In such embodiments, the serialization can be done in such a way that allows conversion of the shift vector d into a scalar. The conversion of a shift vector into a scalar may be done in such a way that shifting the original multi-dimensional signal by the shift vector and then serializing may be equivalent or similar to serializing the multi-dimensional signal first, and then shifting the 1D vectors by the scalar shift. It should be noted that, in various embodiments, the translation parameter d may be represented in other forms and represent various transformations of the signal, such as translations, a shifts, and/or rotations.

A measurement vector may be obtained by applying a sensing matrix to a signal, as shown in equation 3.

$$y=\Phi x \quad \text{[equation 3]}$$

In equation 3, Φ is a sensing matrix and the signal is represented by x.

Equation 4 represents a feature vector extracted from the measurement vector.

$$z=\Psi y \quad \text{[equation 4]}$$

In equation 4, Ψ represents a processing method, which may preserve some features that characterize the measurement vector y and the signal x. In the following it is assumed that Ψ is a linear operator, for example the entries of z may be a subset of the entries of y. However, some embodiments may use other, non-linear operators to derive feature vectors. Similarly, a translation measurement vector and a translation feature vector may define the measurement vector and feature vector derived from a translated signal as shown in equation 5, equation 6, and equation 7, respectively.

$$\tilde{x}=T^d x \quad \text{[equation 5]}$$

$$\tilde{y}=\Phi \tilde{x}=\Phi T^d x \quad \text{[equation 6]}$$

$$\tilde{z}=\Psi \tilde{y}=\Psi \Phi T^d x \quad \text{[equation 7]}$$

It should be noted that the terms "translation measurement vector" and "translation feature vector", do not imply that the measurement vector or feature vectors are actually shifted or translated, but that they correspond to a translation of the original signal, as depicted in and expressed by equation 6 and equation 7, as shown above.

Equation 8 shows computational steps of computing a measurement vector, a feature vector, a translated signal, a translation measurement vector, and a translation feature vector, according to an example embodiment.

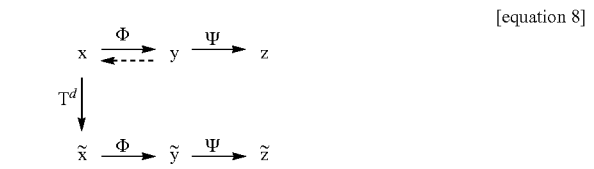

[equation 8]

The dimension of a measurement vector (denoted by M) may be relatively smaller than the dimension of the signal (denoted by N), and thus, estimating the signal from the measurements, shown by a dashed arrow in equation 8, may be relatively difficult and may possibly yield inaccurate results. Therefore, if x is available or otherwise known, then computing z, $\tilde{z}$ may be relatively easy, as shown by following the solid, single line arrows in equation 8. However if only the measurement vector y is available, computing z may be relatively simple, but computing $\tilde{z}$ may be relatively difficult and inaccurate because it may require estimating the signal x from the measurements. Thus, a sensing matrix Φ may be defined as "shift-preserving", for the particular shift d, if it is possible to estimate $\tilde{z}$ from y in a relatively simple and accurate way, without requiring an estimation of the original signal x.

Equation 9 shows computational steps of estimating a feature vector from compressive measurements.

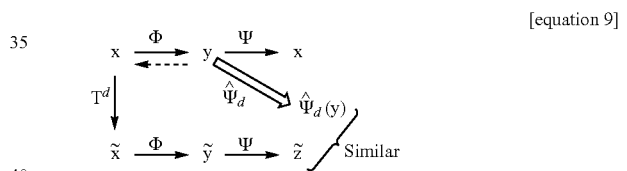

[equation 9]

In equation 9, $\hat{\Psi}_d(y)$ denotes an estimate of $\tilde{z}$ computed from y for the shift d, having a computational path as shown as a double arrow in equation 9. A sensing matrix may be shift-preserving for all possible shifts and/or for a specific set of shifts of interest. A shift-preserving sensing matrix that is applied without specifying a corresponding shift, may indicate a matrix that is shift preserving with respect to a non-zero shift.

In various embodiments, a shift-preserving sensing matrix may be a sensing matrix derived from a circulant matrix.

$$C = \begin{bmatrix} w(0) & w(N-1) & \ldots & w(1) \\ w(1) & w(0) & \ldots & w(2) \\ \vdots & \vdots & \ddots & \vdots \\ w(N-1) & w(N-2) & \ldots & w(0) \end{bmatrix} \quad \text{[equation 10]}$$

Equation 10 represents a circulant matrix, where $c_{m,n}=w(m-n)$, 0≤m, n<N, and where w(n) is a sequence of pseudo random numbers. In various embodiments, w(n) may be any sequence of numbers, and is not limited to a sequence of pseudo random numbers. If it is assumed that both w(n) and x(n) are extended in a periodic manner with a period of N, then equation 11 may be as follows:

$$(Cx)_k = \sum_{n=0}^{N-1} c_{k,n} x(n) = \sum_{n=0}^{N-1} w(k-n)x(n) = (w*x)(k) \quad \text{[equation 11]}$$

In equation 11, (w*x) denotes the convolution of w and x. Using known properties of convolution, equation 12 and equation 13 may be as follows:

$$w*(T^d x) = (T^d w)*x = T^d(w*x) \quad \text{[equation 12]}$$

$$C\tilde{x} = CT^d x = T^d Cx \quad \text{[equation 13]}$$

Referring to equations 3-13 as shown above, $\Phi$ may be defined by $\phi_{i,n} = c_{s(i),n} = w(s(i)-n)$, $0 \leq i < M$, $0 \leq n < N$, where $\{s(0), \ldots, s(M-1)\}$ is a subset of $\{0, \ldots, N-1\}$. Then the entries of a measurement vector $y = \Phi x$ are given by $y(m) = (Cx)_{s(m)}$. Additionally, if $\{q(0), \ldots, q(R-1)\}$ is a set of all indices $0 \leq q(r) < M$ such that for any $0 \leq r < R$ and any shift of interest d, there is an index $0 \leq m' < M$ such that $s(q(r))-d \equiv s(m') \mod(N)$. Denoting $m' = \theta_d(r)$ yields equation 14 below.

$$s(q(r))-d = s(q(\theta_d(r))) \quad \text{[equation 14]}$$

For a measurement vector and a feature vector as defined by equations 3 and 4, respectively, where $z(r) = y(q(r))$, a feature vector that is a subset of the entries of the measurements vector may be derived by equation 15, as follows:

$$\tilde{z}(r) = (\Psi\Phi T^d)_r = (\Phi T^d x)_{q(r)} = (CT^d x)_{s(q(r))} = (T^d Cx)_{s(q(r))} = (Cx)_{s(q(r))-d} = (Cx)_{s(q(\theta_d(r)))} = y(q(\theta_d(r))) = z(\theta_d(r)) \quad \text{[equation 15]}$$

Thus, a translation feature vector can be easily computed from the measurement vector by equation 16 below.

$$(\hat{\Psi}_d(y))_r = y(q(\theta_d(r))), 0 \leq r < R \quad \text{[equation 16]}$$

Accordingly, in various embodiments, a translation feature vector is computed by first computing the feature vector $z = \Psi y$ and then obtaining the translation feature vector by shuffling the entries of z according to $\theta_d$.

It should be noted that example embodiments are not limited to using circulant matrices or to feature extraction operators which select a subset of the entries of the measurement vector to obtain one or more translation feature vectors. According to various embodiments, original feature vectors may be generated by applying any type of shift-preserving sensing matrix to an original feature vector, and different operators may be used to generate an original feature vector and to obtain estimates of one or more translation feature vectors. Furthermore, in the above example, the operator $\hat{\Psi}_d(y)$ is not merely an estimate of the translation feature vector $\Psi\Phi T^d x$, but represents an exact value. However, in various embodiments, $\hat{\Psi}_d(y)$ may be an estimate of $\Psi\Phi T^d x$.

As shown in operation S410, the motion detection device 105 divides the video data into a plurality of blocks. The captured video data includes a sequence of segments, known as frames, where each frame includes a plurality of pixels. Each block may include pixels from one or more frames. In various embodiments, a block may include pixels belonging to a fixed spatial rectangle in several consecutive frames. Each block may span a specific spatial rectangle in two or more consecutive frames. In various embodiments, blocks may be disjointed or overlapping.

As shown in operation S415, the motion detection device 105 multiplies pixels in each block by a spatial window function, which may be advantageous when generating compressive measurements for each block. However, it should be noted that multiplying pixels in each block by a spatial window is optional, and the method may be performed to generate compressive measurements without having to apply a spatial window to each block.

As explained above, when using a sensing matrix based on circulant matrix, the measurements are values selected from the convolution (w*x), where the signal is extended in a periodic manner. This may cause undesired discontinuities at the ends and/or boundaries of the signal domain interval where the signal wraps around. A well-known technique to reduce and/or eliminate the discontinuities is to multiply the signal by a window function. A window function may be applied to a signal in order to allow the signal to "taper" to a near zero (0) value at the ends and/or boundaries of the signal domain. Once a window function is applied to a signal, the discontinuities may be diminished and/or may disappear because the signal values at or near the ends and/or boundaries of the signal domain are at or near zero. In various embodiments, the window function may be two-dimensional when processing still images, and the application of the window function may cause the signal to taper to near zero at the image boundaries.

As shown in operation S420, the motion detection device 105 converts each block into a pixel vector having N pixel values, where N is the number of pixels in a block. For clarity of description it is assumed that a video signal is black and white, and each pixel value represents a level of luminance. In various embodiments, the video signal may be in color video, and at least some of the pixel values represent color and/or chrominance levels. The ordering of the pixels in the vector, which may be referred to as serialization, can be done in various ways. In some embodiments, serialization may be done by ordering rows, then ordering columns, and then ordering frames, as shown table 1.

TABLE 1

| ID | 3D | | |
|---|---|---|---|
| Ser. | Row | Col. | Frm. |
| 0 | 0 | 0 | 0 |
| 1 | 1 | 0 | 0 |
| . | . | . | . |
| . | . | . | . |
| . | . | . | . |
| H − 1 | H − 1 | 0 | 0 |
| H | 0 | 1 | 0 |
| . | . | . | . |
| . | . | . | . |
| . | . | . | . |
| 2H − 1 | H − 1 | 1 | 0 |
| 2H | 0 | 2 | 0 |
| . | . | . | . |
| . | . | . | . |
| . | . | . | . |
| (k − 1)HV − 1 | H − 1 | V − 1 | k − 2 |
| (k − 1)HV | 1 | 0 | k − 1 |
| . | . | . | . |
| . | . | . | . |
| . | . | . | . |
| kHV − 1 | H − 1 | V − 1 | k |

In such embodiments, images include frames, which comprise pixels organized in rows and columns. The number of rows and columns are denoted by V and H, respectively. The one-dimensional (1D) indices in the right hand side of table 1 are serialized indices that correspond to the three-dimensional (3D) indices in the right hand side of table 1. With such an arrangement, a horizontal translation with a shift of one corresponds to translation of the pixel vector with a shift of one, a vertical translation with a shift of one corresponds to a translation of the pixel vector with a shift by H, and a temporal translation with a shift of one frame corresponds to a translation of the pixel vector with shift of HV. If horizontal and/or vertical translation are done in the pixel vector by translating in multiples of one of H, the edge of a row or a frame may end up overlapping the next row and/or frame, respectively. In order to avoid such overlapping, in various embodiments, the block may be extended by zeros in all directions prior to serialization.

As shown in operation S425, the motion detection device 105 multiplies each pixel vector by a shift-preserving sensing matrix to obtain a captured measurement vector In other words, the motion detection device 105 generates measurements by applying the sensing matrix to the pixel vectors of the captured video data.

As shown in operation S430, the motion detection device 105 transmits the captured measurement vector to server 115 for processing. Once the motion detection device 105 transmits the captured measurement vector to server 115 for processing, the motion detection device 105 proceeds back to operation S405 to capture video data having consecutive frames.

Figure 5:
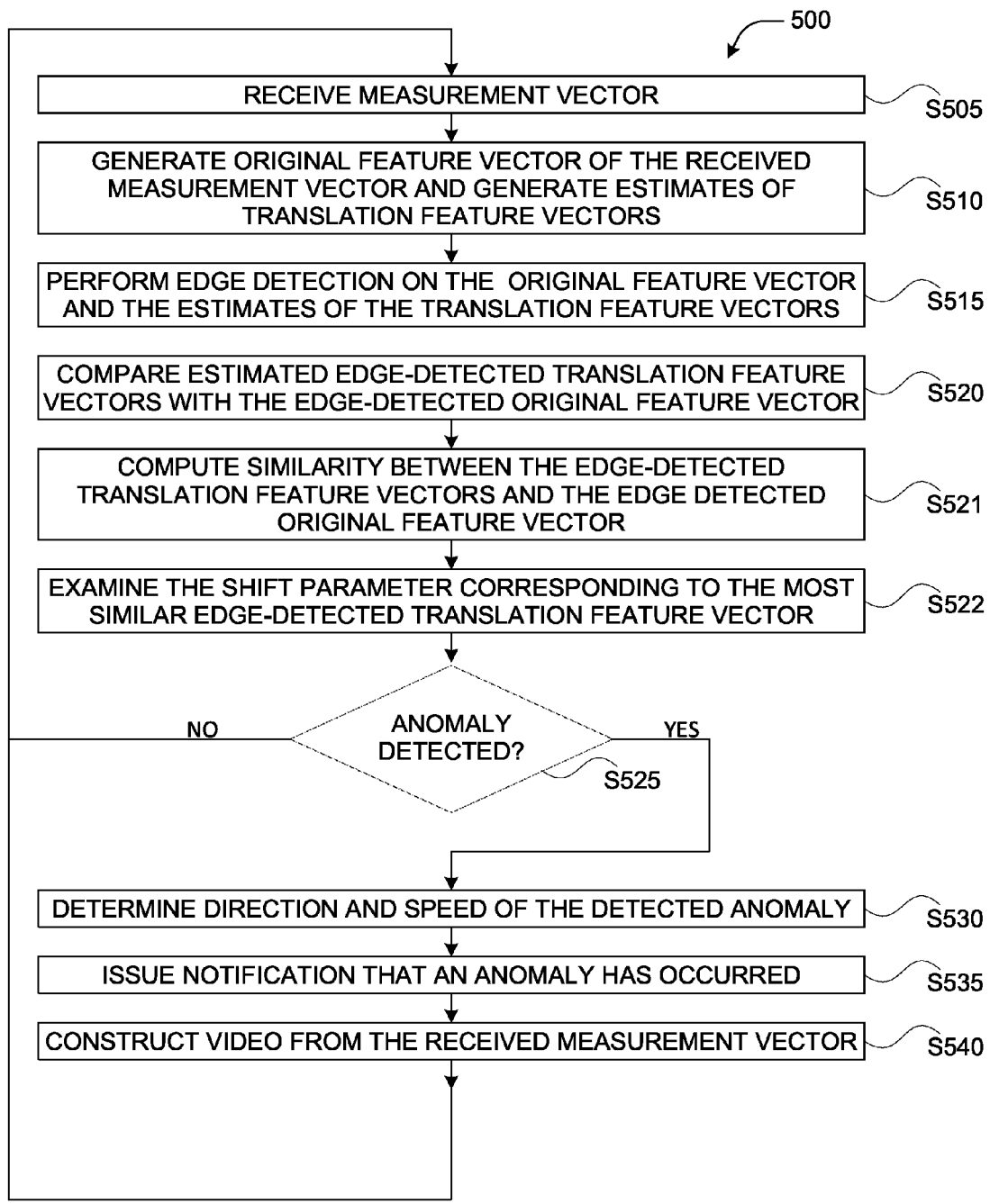
FIG. 5 shows an anomaly detection routine, according to an example embodiment.

FIG. 5 shows an anomaly detection routine 500, according to an example embodiment. Anomaly detection routine 500 may be used to detect anomalies in a set of video data, which has been captured and compressed and/or encoded using compressive sensing with a shift-preserving sensing matrix. For illustrative purposes, the operations of compressive measurement anomaly detection routine 500 will be described as being performed by the server 115 as described above with respect to FIG. 3. However, it should be noted that other similar network elements may operate the anomaly detection routine 500 as described below.

Referring to FIG. 5, as shown in operation S505, the server 115 receives the measurement vector, which was generated by the motion detection device 105 as discussed above with respect to FIG. 4.

As shown in operation S510, the server 115 generates an original feature vector, $\Psi(y)$, of the received measurement vector and generates estimates of translation feature vectors $\hat{\Psi}_d(y)$, where the values of d correspond to shifts corresponding to possible motions. In addition the server may generate estimates of translation vectors $\hat{\Psi}_{d+e(p)}(y)$, $\hat{\Psi}_{e(p)}(y)$, $0 \leq p < P$ where $e(p)$, $0 \leq p < P$ are shift values corresponding neighboring pixels which are to be used in edge detection operation.

An effect of translation on blocks which contain and do not contain motion is described as follows. For example, consider a block that includes an object. If the block spans five (5) frames with an additional all zeros frame appended at the end, a spatial rectangle of the block, which is V rows by H columns, contains the object when the object is stationary. The same block after a temporal (e.g., a circular shift) translation by one frame may be similar to the original block.

Now suppose that the object in the block is moving. The temporally translated block will no longer be similar to the original block because the position of the object changes from frame to frame due to the motion of the object. However, if the block is translated both temporally and spatially, the object in each translated frame can be aligned with the object in the original frame, and thus, a translated block that is very similar to the original block may be obtained. This similarity may be achieved by selecting a translation with specific horizontal and vertical shifts, which correspond to the horizontal and vertical components of the velocity of the moving object. Therefore, if the pixel vector is given, we can detect motion by finding a shift d which minimizes the distance $\|T^d x - x\|$, where $\| \|$ is a suitable norm, (e.g. the root-mean-square distance, also known as the $L^2$ norm). Once the shift is found, it can be converted into three-dimensional (3D) indices. The 3D indices may be used to find a ratio of the horizontal and vertical shift components to the temporal shift component. The ratio may be used to determine the horizontal and vertical velocity component of the object in the block. Note that the minimization need not be over all possible shifts but only over the shifts of interest, that is shift which corresponds to a spatio-temporal translation which can be realistically expected in the scene.

One characteristic of sensing matrices is that they may approximately preserve norms of sparse vectors, that is if x is sparse and $y = \Phi x$ then the ratio $\|y\|:\|x\|$ is close to one (1). Therefore, the distance may be represented by equation 17.

$$\|\psi T^d x - y\| = \|\Phi(T^d x - x)\| \approx \|T^d x - x\| \qquad \text{[equation 17]}$$

Since x and $T^d x$ may not be available at the server, instead of minimizing $\|T^d x - x\|$ we can minimize the distance between the translation measurement vectors $\Phi T^d x$ and the original measurement vector $\Phi x = y$. This, however, also cannot be computed directly, because while y is known, the translation measurement vectors $\Phi T^d x$ may not be available. Suppose that a similarity measure between feature vectors, $\sigma(z, \tilde{z})$, such that if $z = \Psi(y)$, $\tilde{z} = \omega(\tilde{y})$ and $\sigma(z, \tilde{z})$ is relatively small. That is, z and $\tilde{z}$ are similar, then with high probability $\|y - \tilde{y}\|$ is also small. Since $\Phi$ is a shift-preserving matrix, $$\sigma(\hat{\Psi}_d(y), \Psi(y)) \approx \sigma(\Psi(T^d y), \Psi(y)). \qquad \text{[equation 18]}$$

A low value of $\sigma(\hat{\Psi}_d(y), \Psi(y))$ indicates that $\|\Phi T^d x - y\|$ $\|T^d x - x\|$ may be small too. Therefore, minimizing $\sigma(\tilde{\Psi}_d(y), \Psi(y))$ over all shift values of interest gives us an estimate of the shift value which minimizes $\|\Phi T^d x - y\|$, and thus provides an estimate of the velocity of the objects in the block.

The above analysis relies on the signal being sparse signal. However, real-life image and video signals may include non-sparse signals. Thus, in some embodiments, edge detection may be used to sparsify the signal. Edge detection may include any mathematical method that identifies points in image data where a brightness of an image changes sharply or has discontinuities. A common way to perform edge detection is by subtracting from each pixel an average of its neighboring pixels. As a result, pixels that are inside a region of uniform or slowly changing luminosity tend to vanish and the only pixels which have high non-zero values are the pixel at the boundary between regions or objects. For example, after edge detection, the five (5) block frames, as discussed above, would be all zero except for a thin solid line marking the boundary between the object and the background. As a result, performing edge detection makes the signal including the object sparse. When considering pixel vectors, let $x(n)$ be a pixel and let $x(n - e(p))$, $0 \leq p < P$ be its neighboring pixels, that is, pixels in the same frame which are spatially adjacent or very close to $x(n)$. The edge detected signal may be defined by subtracting from each pixel the average of its neighbors, as shown in equation 19:

$$x_e(n) = x(n) - P^{-1} \sum_{p=0}^{P-1} x(n + e(p)) \qquad \text{[equation 19]}$$

The edge detected signal may also be defined using translation notation, as shown in equation 20:

$$x_e = x - P^{-1}\sum_{p=0}^{P-1} T^{e(p)}x \quad \text{[equation 20]}$$

The edge detected-detected signal preserves the position of the objects in each frames in the form of their silhouettes, thus, performing edge detection on a signal is preferable in various embodiments. Next, a shift d which minimizes $\|T^d x_e - x_e\|$ over all shifts of interest is determined. Since $\Phi$ is a sensing matrix and the signal $x_e$ is sparse, the shift can be approximated by minimizing $\|\Phi T^d x_e - \Phi x_e\|$, which is further approximated by the minimization of $\sigma(\Psi(\Phi T^d x_e), \Psi(\Phi x_e))$, which, by the linearity of $\Psi$ gets the form of equation 21:

$$\sigma(\Psi(\Phi T^d x_e), \Psi(\Phi x_e)) = \sigma\left(\Psi(\Phi T^d x) - P^{-1}\sum_{p=0}^{P-1}\Psi(\Phi T^{d+e(p)}x),\right. \quad \text{[equation 21]}$$

$$\left.\Psi(y) - P^{-1}\sum_{p=0}^{P-1}\Psi(\Phi T^{e(p)}x)\right) \approx$$

$$\sigma\left(\hat{\Psi}_d(y) - P^{-1}\sum_{p=0}^{P-1}\hat{\Psi}_{d+e(p)}(y), \Psi(y) - P^{-1}\sum_{p=0}^{P-1}\hat{\Psi}_{e(p)}(y)\right)$$

The result of incorporating edge detection into the calculation is that instead of computing the similarity between an feature vector $\Psi(y)$ and an estimate of a translation feature vector, $\hat{\Psi}_d(y)$, the similarity between two corresponding linear combinations of estimated translation feature vectors, $\Psi(y) - P^{-1}\Sigma_{p=0}^{P-1}\hat{\Psi}_{e(p)}(y)$ and $\hat{\Psi}_d(y) - P^{-1}\Sigma_{p=0}^{P-1}\hat{\Psi}_{d+e(p)}(y)$ may be computed. Note that in this case, the shifts values of interest are the shifts d which correspond to possible translations as well as the shifts of the form d+e(p), $0 \leq p < P-1$ As shown in operation S515, the server 115 performs edge detection. In various embodiments, edge detection may be performed as shown in equations 19 and 20, as discussed above. The results of the operation is edge-detected translation feature vectors, which are linear combinations of the original feature vector and the estimates of the translation feature vectors. However, it should be noted that performing edge detection on the original feature vector is optional, and the method may be performed to detect anomalies without having to perform edge detection.

Referring back to FIG. 5, as shown in operation S520, the server 115 compares the estimated edge-detected translation feature vectors with the edge-detected original feature vector.

In operation 521, the similarity $\sigma(z, \tilde{z})$ between the edge-detected translation feature vectors and the edge detected original feature vector (or, if edge detection has not been performed, the similarity $\sigma(z, \tilde{z})$ between the translation feature vectors and the original feature vector) is computed. The similarity values are compared and an edge detected translation feature vector which is most similar to the edge detected original feature vector is selected.

In operation 522, the shift parameter d corresponding to the most similar edge detected translation feature vector is examined to determine the speed and direction of motion in the block. In addition, the level of similarity $\sigma(z, \tilde{z})$ is examined to determine a measure for the certainty of the estimated speed and direction.

It should also be noted that example embodiments are not limited to comparing the entire original feature vector with an entire one or more translation feature vectors. In various embodiments, the comparison may include comparing one or more elements of one or more sets of the original feature vector with one or more elements of the set of first feature vectors. Additionally, in some embodiments, where multiple original feature vectors are generated, a degree of similarity may be determined between one or more elements of each generated original feature vectors.

As shown in operation S525, the server 115 determines if an anomaly is detected. Anomaly detection is based on an estimated speed and/or direction of objects in a given block. If the speed and/or direction are outside a desired "normal" range, an anomaly may be declared or otherwise determined to exist. The "normal" range may be different from block to block. The "normal" range may vary according to a position of the block. In addition, the decision about anomaly may be modified based on the certainty of the estimated speed and/or direction. For example, if the estimated speed and/or direction are outside the normal range but within a desired margin, and the certainty of the estimation is low, an anomaly may not be declared because of the possibility that the actual speed and/or direction are within the normal range. On the other hand, a very low certainty determination may indicate that there are some changes in the block, but they cannot be described as a uniform motion. In that case, an anomaly may be declared even if the estimated speed and/or direction are within the normal range. As discussed above, an amount of difference between the original feature vector and the one or more translation feature vectors, or a desired degree of similarity, may represent an anomaly in a source signal and/or video data. The anomaly may be determined to be a motion, or a movement in a body or object, if the anomaly includes a desired degree of similarity and/or if the anomaly includes a direction. For instance, if an anomaly is detected, but includes a relatively high degree of similarity, then the anomaly maybe determined to not be a motion. Conversely, if an anomaly is detected that includes a relatively low degree of similarity then the anomaly maybe determined to be a motion. In this way, the degree of similarity may be used to determine a certainty of a detected motion. Additionally, as stated above, what constitutes a relatively high degree of similarity or a relatively low degree of similarity may be any desired amount or threshold. The determination of motion may be based on the translation parameters associated with the feature vectors or the elements of the feature vectors determined to be similar to each other, and/or a degree of similarity of the feature vectors or the elements of the feature vectors determined to be similar to each other. It should be noted that the ranges, margins, and/or other like parameters, as discussed above, may be determined based on empirical studies and/or other like analyses.

If the server 115 does not detect an anomaly in operation S525, the server 115 proceeds back to operation S505 to receive another measurement vector. Otherwise, if the server 115 detects an anomaly in operation S525, the server 115 proceeds to operation S530 to determine a direction and/or speed of the detected motion as discussed above.

As shown in operation S535, the server 115 issues a notification that an anomaly has occurred. The notification may include information about the determined direction and/or speed. According to various embodiments, a notification may be issued to an operator who may receive take appropriate actions.

In various embodiments, issuing a notification or "flagging" a source signal or video stream may involve sending a message to one or more client devices (e.g., client devices 120A-B) of a surveillance system. Additionally, issuing the notification or flag may involve generating or otherwise defining a database record or other like file that contains information regarding a determined motion for a stream meeting and/or exceeding the desired threshold.

As shown in operation S540, the server 115 constructs video from the received measurement vector. Once the client devices are issued a notification or otherwise alerted of a source signal or video stream that includes a determined motion meeting and/or exceeding the desired threshold, operators associated with the one or more client devices may wish to review the video in order to observe the detected motion. Thus, in various embodiments, the compressed and/or encoded video may be constructed from the received measurement vectors and/or the feature vectors. However, it should be noted that reconstructing the video is optional, and the method may be performed without having to construct and/or reconstruct the video.

Once the server 115 constructs video from the received measurement vector in operation S540, the server 115 proceeds back to operation S505 to receive another measurement vector. In such embodiments where the video is not reconstructed, the server 115 may proceed back to operation S505 to receive another measurement vector after a notification is issued in operation S535.

As will be appreciated, the example embodiments as described above provide several advantages. First, example embodiments allow anomalies to be detected in video data without involving a human operator. Second, example embodiments allow anomalies to be detected in video data without requiring an excessive amount of computational and/or network resources. Third, example embodiments provide methods and systems for detecting anomalies in compressed video data without constructing and/or reconstructing the compressed video data.

The invention being thus described, it will be obvious that the same may be varied in many ways. Such variations are not to be regarded as a departure from the invention, and all such modifications are intended to be included within the scope of the present invention.

We claim:

1. A method for processing a source signal to detect anomalies, the method comprising:
   receiving, using at least one processor, a measurement vector of compressive measurements, the measurement vector being derived by applying a sensing matrix to the source signal;
   generating, using the at least one processor, at least one first feature vector from the measurement vector, the first feature vector being an estimate of a second feature vector, the second feature vector corresponding to a translation of the source signal, the generating including generating more than one first feature vectors, each of the first feature vectors having a corresponding translation parameter;
   comparing, using the at least one processor, a group of elements of a set of the first feature vectors with other elements of the set of first feature vectors;
   determining, using the at least one processor, which elements in the group of the set of the first feature vectors are similar to the other elements of the set of first feature vectors; and
   detecting, using the at least one processor, an anomaly in the source signal based on the first feature vector.

2. The method of claim 1, wherein generating the at least one first feature vector is done without reconstructing the source signal.

3. The method of claim 1, wherein the generating includes computing linear combinations of the at least one first feature vector.

4. The method of claim 1, wherein the sensing matrix is derived from a circulant matrix such that the sensing matrix contains a row that is obtained by shifting a different row in the sensing matrix.

5. The method of claim 1, wherein the source signal is multi-dimensional and the translation parameter includes translations in one or more dimensions.

6. The method of claim 5, wherein the source signal is obtained from one or more image frames.

7. The method of claim 6, further comprising:
   performing, using the at least one processor, edge detection by generating a linear combination of the at least one first feature vector,
   the performing corresponding to subtracting a linear combination of neighboring pixels from pixels in the source signal.

8. The method of claim 6, wherein the detecting an anomaly includes detecting motion in the one or more image frames.

9. The method of claim 8, wherein more than one first feature vectors are generated, each of the first feature vectors having a corresponding translation parameter, the method further comprising:
   comparing, using the at least one processor, a group of elements of a set of the first feature vectors with other elements of the set of first feature vectors, and
   determining, using the at least one processor, which elements in the group of the set of the first feature vectors are similar to the other elements of the set of first feature vectors.

10. The method of claim 9, further comprising:
    determining, using the at least one processor, at least one of a speed of the detected motion, a direction of the detected motion, and a certainty of the detected motion,
    the determining the at least one of the speed of the detected motion, the direction of the detected motion, and the certainty of the detected motion being based on at least one of (i) the translation parameters associated with the elements determined to be similar to each other, and (ii) a degree of similarity of the elements determined to be similar to each other.

11. The method of claim 8, wherein the detected motion triggers an action if the detected motion meets at least one criterion.

12. A method for obtaining a measurement vector for processing a source signal to detect anomalies, the method comprising:
    generating, using at least one processor, a measurement vector by applying a sensing matrix to the source signal, the sensing matrix being a shift-preserving sensing matrix, the measurement vector being used to detect anomalies in the source signal, wherein
    more than one first feature vectors is generated from the measurement vector, the first feature vector being an estimate of a second feature vector, the second feature vector corresponding to a translation of the source signal, each of the first feature vectors having a corresponding translation parameter,
    a group of elements of a set of the first feature vectors are compared with other elements of the set of first feature vectors, and elements in the group of the set of the first feature vectors are analyzed to determine which are similar to the other elements of the set of first feature vectors.

13. The method of claim 12, wherein the source signal is multi-dimensional.

14. The method of claim 13, wherein the source signal is obtained from one or more images.

15. The method of claim 14, wherein one or more images are derived by applying a windowing function to one or more original images.

16. The method of claim 14, wherein the one or more images are a video signal.

17. A server for processing a source signal to detect anomalies, the server configured to:
    receive a measurement vector of compressive measurements, the measurement vector being derived by applying a sensing matrix to a source signal;
    generate at least one first feature vector from the measurement vector, the first feature vector being an estimate of a second feature vector, the second feature vector corresponding to a translation of the source signal, the generating including generating more than one first feature vectors, each of the first feature vectors having a corresponding translation parameter;
    compare a group of elements of a set of the first feature vectors with other elements of the set of first feature vectors;
    determine which elements in the group of the set of the first feature vectors are similar to the other elements of the set of first feature vectors; and
    detect an anomaly in the source signal based on the first feature vector.

18. A image detection device for obtaining a measurement vector for processing a source signal to detect anomalies, the image detection device configured to:
    generate a set of compressive measurements by applying a sensing matrix to a source signal, the sensing matrix being a shift-preserving sensing matrix; and
    generate a measurement vector based on the set of compressive measurements, the measurement vector being used to detect anomalies in the source signal,
    wherein
    more than one first feature vectors is generated from the measurement vector, the first feature vector being an estimate of a second feature vector, the second feature vector corresponding to a translation of the source signal, each of the first feature vectors having a corresponding translation parameter,
    a group of elements of a set of the first feature vectors are compared with other elements of the set of first feature vectors, and
    elements in the group of the set of the first feature vectors are analyzed to determine which are similar to the other elements of the set of first feature vectors.

19. An image detection system for detecting anomalies in a source signal, the system comprising:
    an image detection device for obtaining a measurement vector for processing the source signal, the image detection device configured to,
        generate a set of compressive measurements by applying a shift-preserving sensing matrix to a source signal, and
        generate a measurement vector based on the set of compressive measurements; and
    a server for processing the source signal, the server configured to,
        receive the measurement vector;
        generate at least one first feature vector from the measurement vector, the first feature vector being an estimate of a second feature vector, the second feature vector corresponding to a translation of the source signal, the generating including generating more than one first feature vectors, each of the first feature vectors having a corresponding translation parameter;
        compare a group of elements of a set of the first feature vectors with other elements of the set of first feature vectors;
        determine which elements in the group of the set of the first feature vectors are similar to the other elements of the set of first feature vectors; and
        detect an anomaly in the source signal based on the first feature vector.

* * * * *